(12) United States Patent
Kawasaki

(10) Patent No.: US 8,253,169 B2
(45) Date of Patent: Aug. 28, 2012

(54) SEMICONDUCTOR DEVICE AND MANUFACTURING METHOD FOR SEMICONDUCTOR DEVICE

(75) Inventor: Hisao Kawasaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 333 days.

(21) Appl. No.: 12/554,423

(22) Filed: Sep. 4, 2009

(65) Prior Publication Data

US 2010/0059798 A1     Mar. 11, 2010

(30) Foreign Application Priority Data

Sep. 9, 2008  (JP) ................. 2008-230963

(51) Int. Cl.
  *H01L 29/66*   (2006.01)
(52) U.S. Cl. ......... 257/194; 438/167; 438/172; 438/182
(58) Field of Classification Search .............. 257/194; 438/167, 172, 182
  See application file for complete search history.

(56) References Cited

U.S. PATENT DOCUMENTS

2005/0253168 A1* 11/2005 Wu et al. .............. 257/192
2006/0108602 A1* 5/2006 Tanimoto .............. 257/192

FOREIGN PATENT DOCUMENTS

| EP | 1901341 A1 * | 3/2008 |
|---|---|---|
| JP | 10-135239 | 5/1998 |
| JP | 3723780 | 9/2005 |
| JP | 2007-537594 | 12/2007 |
| WO | WO 2005/114743 A2 | 12/2005 |

* cited by examiner

*Primary Examiner* — Ha Tran T Nguyen
*Assistant Examiner* — Aaron Dehne
(74) *Attorney, Agent, or Firm* — Oblon, Spivak, McClelland, Maier & Neustadt, L.L.P.

(57) ABSTRACT

There is provided a semiconductor device including: a SiC substrate; an AlGaN layer formed on the SiC substrate; a source electrode and a drain electrode formed on the AlGaN layer so as to be spaced from each other; a first insulation film formed between the source electrode and the drain electrode and having a band-like opening parallel to the drain electrode and the source electrode; a gate electrode formed at the opening in the first insulation film; a second insulation film formed on the first insulation film in such a manner as to cover a surface of the gate electrode; and a source field plate electrode which is formed on the second insulation film and the source electrode and an end portion of which on the drain electrode side is spaced from the second insulation film, thereby suppressing degradation in device performance.

6 Claims, 5 Drawing Sheets

SEMICONDUCTOR DEVICE AND MANUFACTURING METHOD FOR SEMICONDUCTOR DEVICE

CROSS REFERENCE TO RELATED APPLICATIONS

This application is based upon and claims the benefit of priority from the prior Japanese Patent Application No. 2008-230963 filed in Japan on Sep. 9, 2008; the entire contents of which are incorporated herein by reference.

TECHNICAL FIELD

The present invention relates to a semiconductor device operating in a high-frequency band and in particular, to a field effect transistor (FET) using a nitride semiconductor or the like.

BACKGROUND ART

A field effect transistor (FET) using a compound semiconductor such as GaN, having excellent high-frequency characteristics, is widely in practical use as a semiconductor device operating in a microwave band.

The FET has, for example, the following structure, as disclosed in Japanese Patent Application National Publication No. 2007-537594. A rectangular source electrode and a rectangular drain electrode are formed, spaced from each other, on an operating layer on a semiconductor substrate. Between the source electrode and the drain electrode, a band-like gate electrode is formed. On the operating layer, a first insulation film is formed between the source electrode, the gate electrode and the drain electrode. On the first insulation film, a second insulation film is formed so as to cover the gate electrode. In a region from a top of the source electrode to a top of the second insulation film, a source field plate electrode is formed. The source field plate electrode is formed from the top of the source electrode to a vicinity of the drain electrode. On the source field plate electrode and between the source field plate electrode and the drain electrode, a third insulation film is formed.

According to the FET, formation of the source field plate electrode can lower a potential increased locally at a drain electrode side end portion of the source electrode. Hence, the FET capable of applying a high voltage can be achieved. However, since an interval between the source field plate electrode and the drain electrode is small, a high voltage is applied to the third insulation film formed between the source field plate electrode and the drain electrode. At this time, the third insulation film is damaged, which poses a problem of degradation in FET performance. Therefore, it is very important to form a source field plate electrode so that a distance between the source field plate electrode and the drain electrode is as designed, that is, to form the source field plate electrode to have a designed length.

As a method for forming the source field plate electrode to have a designed length, the following method is known, as disclosed in Japanese Patent Application Laid-Open No. 10-135239. The method is for metal vapor deposition using a resist layer having an overhang opening in forming a source field plate electrode of a semiconductor device.

As described above, by metal vapor deposition using the resist layer having the overhang opening, metal vapor-deposited in the opening and metal vapor-deposited on the resist layer can be spaced from each other. Hence unnecessary metal vapor-deposited on the resist layer can also be removed when removing the resist layer. Accordingly, no unnecessary metal is left on the field plate electrode, which allows the field plate electrode having the designed length to be formed.

However, in performing metal vapor deposition using the resist layer having the overhang opening in this way, there is formed a gap between an end portion of the source field plate electrode and a side wall of the opening in the resist layer, and therefore a deposited metal component diagonally entering the opening and metal deposited in the opening may flow into the gap, which generates a thin trailing portion at the end of the source field plate electrode. Accordingly, conventionally, when the trailing portion is formed, the distance between the source field plate electrode and the drain electrode is shortened and thus the third insulation film is damaged, which poses a problem of degradation in FET performance.

SUMMARY

According to an embodiment of the present invention, there is provided a semiconductor device comprising: a semiconductor substrate; an operating layer formed on the semiconductor substrate; a source electrode and a drain electrode formed on the operating layer so as to be spaced from each other; a first insulation film formed between the source electrode and the drain electrode and having a band-like opening between the drain electrode and the source electrode; a gate electrode formed at the opening in the first insulation film; a second insulation film formed on the first insulation film in such a manner as to cover a surface of the gate electrode; and a source field plate electrode which is formed on the second insulation film and the source electrode and an end portion of which on the drain electrode side is spaced from the second insulation film.

Further, according to an embodiment of the present invention, there is provided a manufacturing method for a semiconductor device comprising the steps of: after forming a source electrode and a drain electrode on an operating layer of a semiconductor substrate, forming a first insulation film having a band-like opening between the electrodes; forming a first resist layer having a first opening on the first insulation film in such a manner that the first opening is positioned above the band-like opening; forming a gate electrode by vapor-depositing a metal from above the first resist layer; forming a second insulation film on the first insulation film in such a manner as to cover a surface of the gate electrode; forming a second resist layer having a tapered second opening which allows a part of the second insulation film and the source electrode to be exposed; forming a third resist layer on the second resist layer, the third resist layer having an overhang third opening having an opening area larger than that of the second opening, and the third opening being positioned above the second opening; forming a source field plate electrode by vapor-depositing a metal from above the third resist layer having the third opening; and after the metal vapor deposition, removing the second resist layer and the third resist layer.

DETAILED DESCRIPTION

An embodiment of the present invention will be described below with reference to the accompanying drawings.

Figure 1:
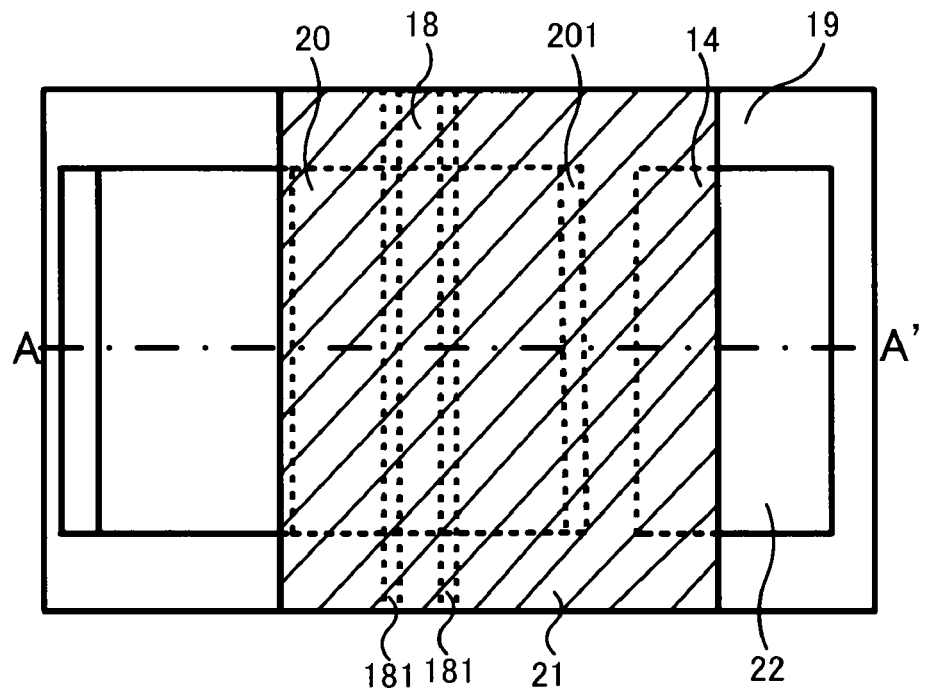
FIG. 1 is a top view illustrating a structure of a semiconductor device according to an embodiment of the present invention.
Figure 2:
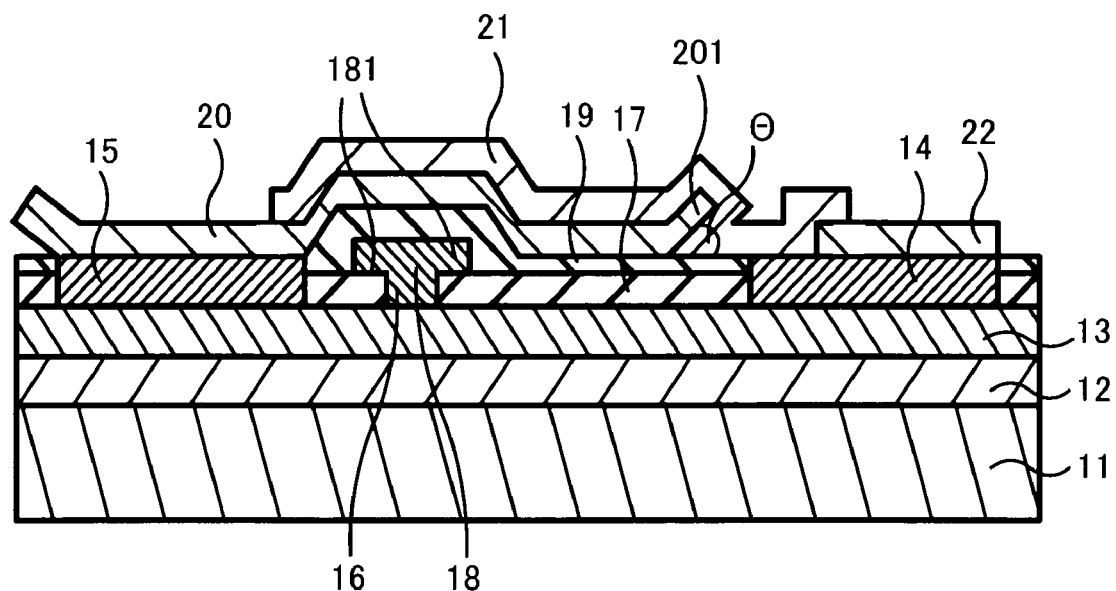
FIG. 2 is a sectional view taken along an alternate long and short dashed line A-A' of FIG. 1.

FIG. 1 is a top view illustrating a semiconductor device according to the present embodiment. FIG. 2 is a sectional view taken along an alternate long and short dashed line A-A' of FIG. 1.

As illustrated in FIG. 2, in the semiconductor device presented in the present embodiment, a GaN buffer layer 12 is formed on a SiC substrate 11. On the GaN buffer layer 12, there is formed an AlGaN layer 13 which is an operating layer.

On the AlGaN layer 13, a drain electrode 14 and a source electrode 15, each of which forms an ohmic contact with the AlGaN layer 13, are formed to be spaced from each other. The drain electrode 14 and the source electrode 15 are composed of, for example, an alloy in which Ti, Al, Ni and Au are laminated in this order, respectively. The drain electrode 14 and the source electrode 15 are rectangular, as illustrated in FIG. 1.

Thicknesses of respective films in the alloy forming the drain electrode 14 and the source electrode 15 are, for example, Ti=20 nm, Al=200 nm and Au=200 nm.

On a part of the drain electrode 14, an electrode pad 22 is formed.

In a region on the AlGaN layer 13 except the drain electrode 14 and the source electrode 15, a first insulation film 17 is formed. The first insulation film 17 has a band-like opening 16 parallel to and between the drain electrode 14 and the source electrode 15. In the opening 16, a band-like gate electrode 18 is formed as illustrated in FIG. 1. The gate electrode 18 is composed of, for example, an alloy in which Ni and Au are laminated in this order, and has a Schottky contact at a position in contact with the AlGaN layer 13.

Thicknesses of respective films in the alloy forming the gate electrode 18 are, for example, Ni=50 nm and Au=500 nm.

On a side portion of the gate electrode 18, a gate field plate electrode 181 is formed integrally with the gate electrode 18. On the first insulation film 17, a second insulation film 19 is formed so as to cover the gate electrode 18 and the gate field plate electrode 181.

In a region from a top of the source electrode 15 to a vicinity of the drain electrode 14 on the source electrode 15 and the second insulation film 19, a source field plate electrode 20 is formed. The source field plate electrode 20 is composed of, for example, an alloy in which Ti, Pt and Au are laminated in this order.

The source field plate electrode 20 is covered with a surface protection layer 21. The surface protection layer 21 extends onto a part of the drain electrode 14 and a part of an electrode pad 22.

The source field plate electrode 20 has an end portion 201, which is formed spaced from the second insulation film 19. In this case, an angle θ between a surface of the second insulation film 19 and the end portion 201 of the source field plate electrode 20 is, for example, 60°. In this case, the end portion 201 of the source field plate electrode 20 is formed so as not to be positioned above the drain electrode 14. The surface protection layer 21 is also formed between the second insulation film 19 and the end portion 201 of the source field plate electrode 20.

Figure 3:
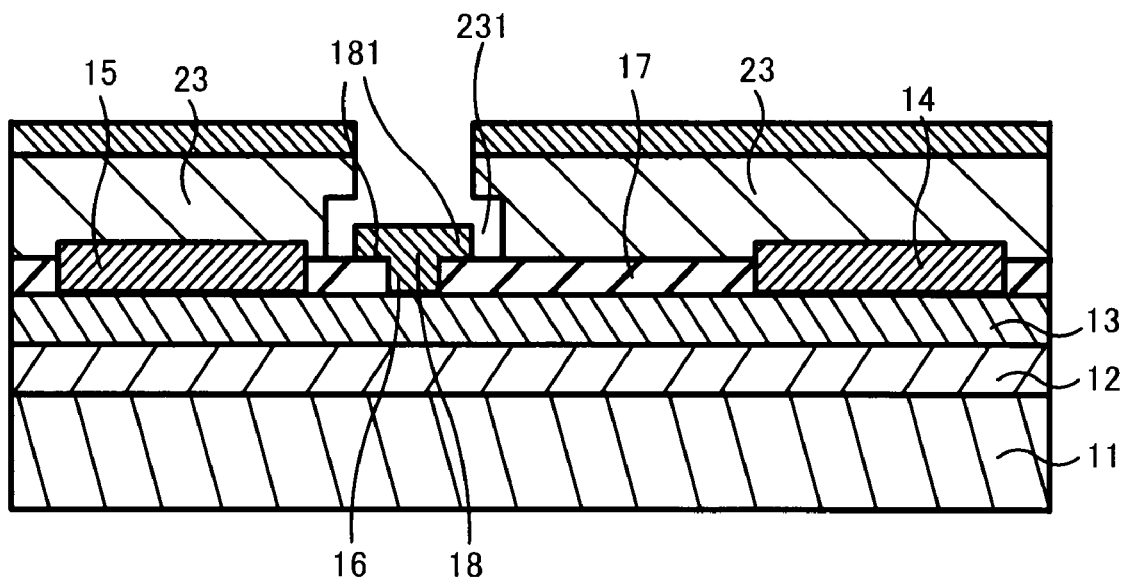
FIG. 3 is a sectional view illustrating a manufacturing method for a semiconductor device according to an embodiment of the present invention, taken along the alternate long and short dashed line A-A' of FIG. 1.

Next, referring to FIGS. 2 to 8, a manufacturing method for the semiconductor device according to the present embodiment will be described below. Each of FIGS. 2 to 8 is a sectional view illustrating the manufacturing method for the semiconductor device according to the embodiment of the present invention, taken along the alternate long and short dashed line A-A' of FIG. 1;

First, as illustrated in FIG. 3, on the SiC substrate 11, the GaN buffer layer 12 and the AlGaN layer 13 are laminated in this order. On the AlGaN layer 13, the rectangular source electrode 15 and the rectangular drain electrode 14 are then formed. Further, on the AlGaN layer 13 except the drain electrode 14 and the source electrode 15, the first insulation film 17 is formed. At the first insulation film 17 between the drain electrode 14 and the source electrode 15, the band-like opening 16 for forming the gate electrode 18 is then formed. Next, on the first insulation film 17, the source electrode 15 and the drain electrode 14, a first resist layer 23 having an overhang first opening 231 is formed. The overhang first opening 231 is formed above the band-like opening 16. Ni and Au are vapor-deposited from above the first resist layer 23 in this order.

Figure 4:
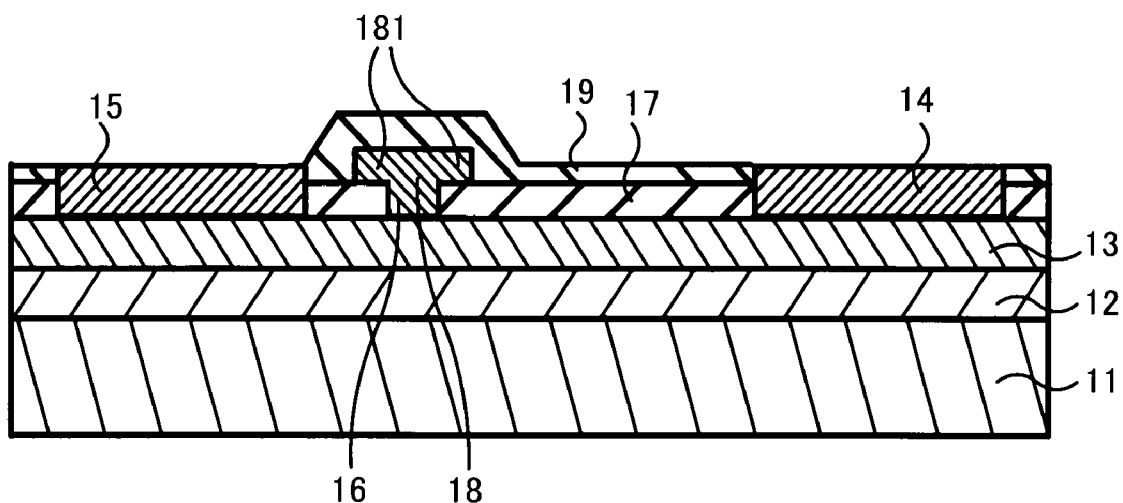
FIG. 4 is a sectional view illustrating a manufacturing method for a semiconductor device according to the embodiment of the present invention, taken along the alternate long and short dashed line A-A' of FIG. 1.

Subsequently, as illustrated in FIG. 4, by removing the first resist layer 23, the gate electrode 18 and the gate field plate electrode 181 are formed. Then, on the first insulation film 17, the second insulation film 19 is formed in such a manner as to cover the gate electrode 18 and the gate field plate electrode 181.

Figure 5:
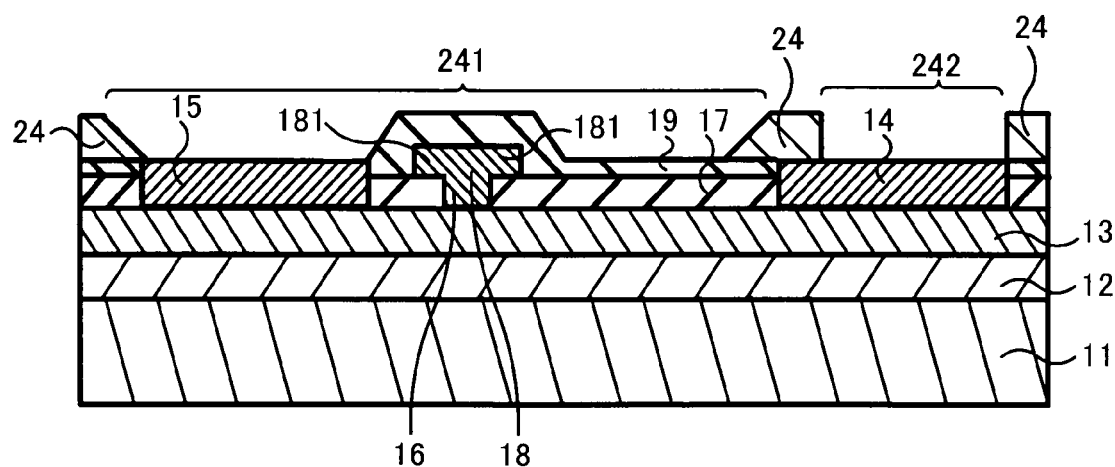
FIG. 5 is a sectional view illustrating a manufacturing method for a semiconductor device according to the embodiment of the present invention, taken along the alternate long and short dashed line A-A' of FIG. 1.

Next, as illustrated in FIG. 5, a second resist layer 24 is formed on the drain electrode 14, the source electrode 15 and the second insulation film 19. The resist layer 24 has a second opening 241 which allows a surface of the source electrode 15 and a part of the second insulation film 19 to be exposed. The second opening 241 has an opening area which increases from the lower portion toward the upper portion thereof. That is, the second opening 241 has a tapered shape in cross section.

The second resist layer 24 further has an opening 242 which allows a part of a surface of the drain electrode 14 to be exposed. However, the shape of the opening 242 is not limited unlike the shape of the second opening 241.

Figure 6:
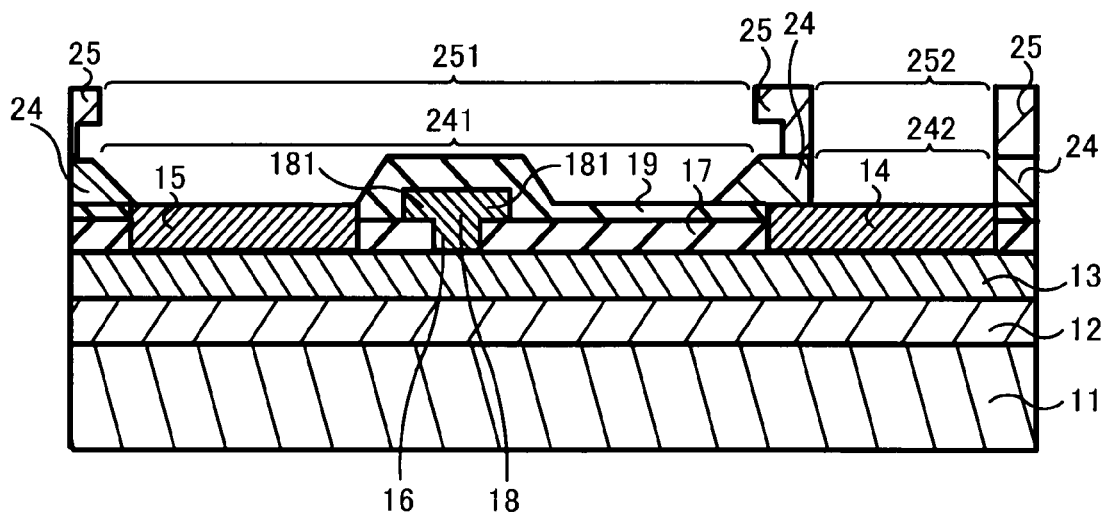
FIG. 6 is a sectional view illustrating a manufacturing method for a semiconductor device according to the embodiment of the present invention, taken along the alternate long and short dashed line A-A' of FIG. 1.

Next, as illustrated in FIG. 6, on the second resist layer 24, a third resist layer 25 having a third opening 251 is formed such that the third opening 251 is positioned above the second opening 241. The resist layer 25 has the overhang third opening 251 having a lower portion larger than the second opening 241 area and an upper portion of almost the same opening area as the second opening 241 area.

The third resist layer 25 further has an opening 252 which allows a part of a surface of the drain electrode 14 to be exposed. However, the shape of the opening 252 is not limited unlike the shape of the third opening 251.

The third resist layer 25 is, for example, a single-layered resist layer composed of a negative resist. The overhang third opening 251 is formed by, for example, forming a resist mask (not illustrated) on the single-layered resist layer, and then immersing the resist mask in a chemical. The overhang third opening 251 may be obtained using any other method for forming such an overhang structure.

An opening 252 which allows a part of a surface of the drain electrode 14 to be exposed may be formed according to any method.

Figure 7:
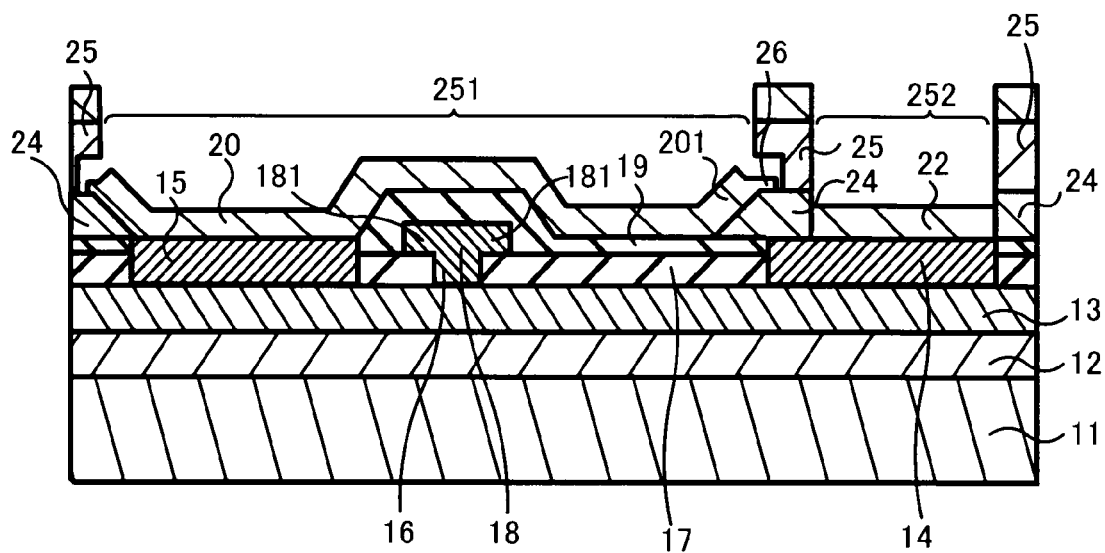
FIG. 7 is a sectional view illustrating a manufacturing method for a semiconductor device according to the embodiment of the present invention, taken along the alternate long and short dashed line A-A' of FIG. 1.
Figure 8:
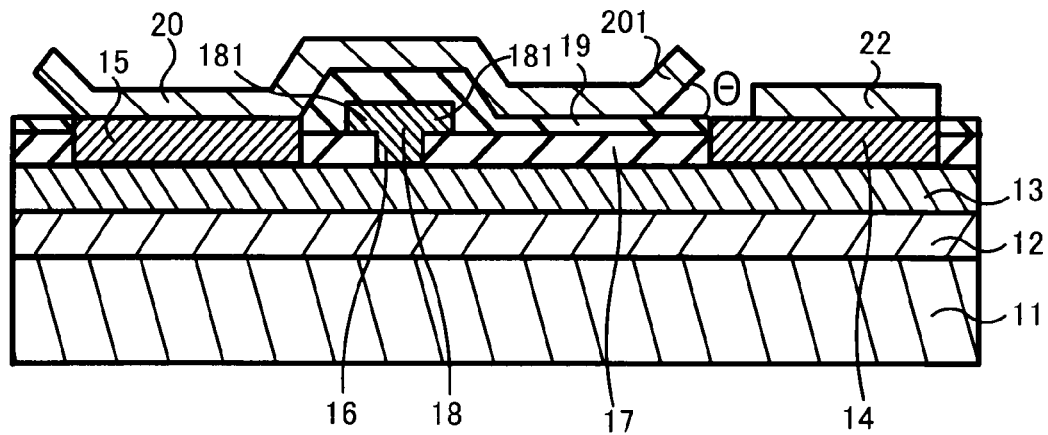
FIG. 8 is a sectional view illustrating a manufacturing method for a semiconductor device according to the embodiment of the present invention, taken along the alternate long and short dashed line A-A' of FIG. 1.

Next, as illustrated in FIG. 7, by vapor-depositing Ni and Au in this order from above the third resist layer 25, the source field plate electrode 20 and the electrode pad 22 are formed. In this process, due to a metal component diagonally entering the third opening 251 and a flow of the deposited metal, a trailing portion 26 is formed at the end portion 201 of the source field plate electrode 20.

The trailing portion 26 is mostly composed of Au, but Ni is also slightly contained therein.

Finally, as illustrated in FIG. 7, the second resist layer 24 and the third resist layer 25 are removed. In this process, the trailing portion 26 illustrated in FIG. 7, which is formed on the second resist layer 24, is removed with the removal of the second resist layer 24 and the third resist layer 25.

After the source field plate electrode 20 is formed as described above, the surface protective film 21 is formed so as to cover a surface of the source field plate electrode 20 and fill a space between the second insulation film 19 and the end portion 201 of the source field plate electrode 20, thus completing the semiconductor device of the present invention illustrated in FIGS. 1 and 2.

As described above, in the semiconductor device of the present embodiment, the end portion 201 of the source field plate electrode 20 is formed so as to be spaced from the second insulation film 19. In this case, a portion which functions as a field plate electrode is only a portion in contact with the second insulation film 19. The end portion 201 spaced from the second insulation film 19 does not function as a field plate electrode. Hence, the source field plate electrode 20 can be formed to have an designed length.

No trailing portion 26 is formed at the end portion 201 of the source field plate electrode 20. Therefore, the source field plate electrode 20 can be formed such that the surface protection layer 21 formed between the end portion 201 of the source field plate electrode 20 and the drain electrode 14 is not damaged during operation of the semiconductor device.

Hence, a semiconductor device capable of suppressing degradation in device performance can be provided.

An embodiment of the present invention has been presented above. However, embodiments of the present invention are not limited thereto and may be optionally modified or varied without departing from the spirit or scope of the present invention.

For example, the angle θ between the end portion 201 of the source field plate electrode 20 and the surface of the second insulation film 19 is 60° in the present embodiment. However, this angle may be any angle larger than 0° but not larger than 90°. However, as this angle θ is larger, a distance between the end portion 201 of the source field plate electrode 20 and the drain electrode 14 can be made longer. Accordingly, preferably, the angle θ is set to be larger.

In the embodiment described above, the gate field plate electrodes 181 are formed on both sides of the gate electrode 18. However, the gate field plate electrode 181 does not always have to be formed. Accordingly, in a manufacturing method, the overhang first opening 231 formed in the first resist layer 23 does not always have to have this shape.

In the embodiment described above, a GaN-based FET formed on a SiC substrate is described. However, the present invention is applicable to any form of FET.

Figure 9:
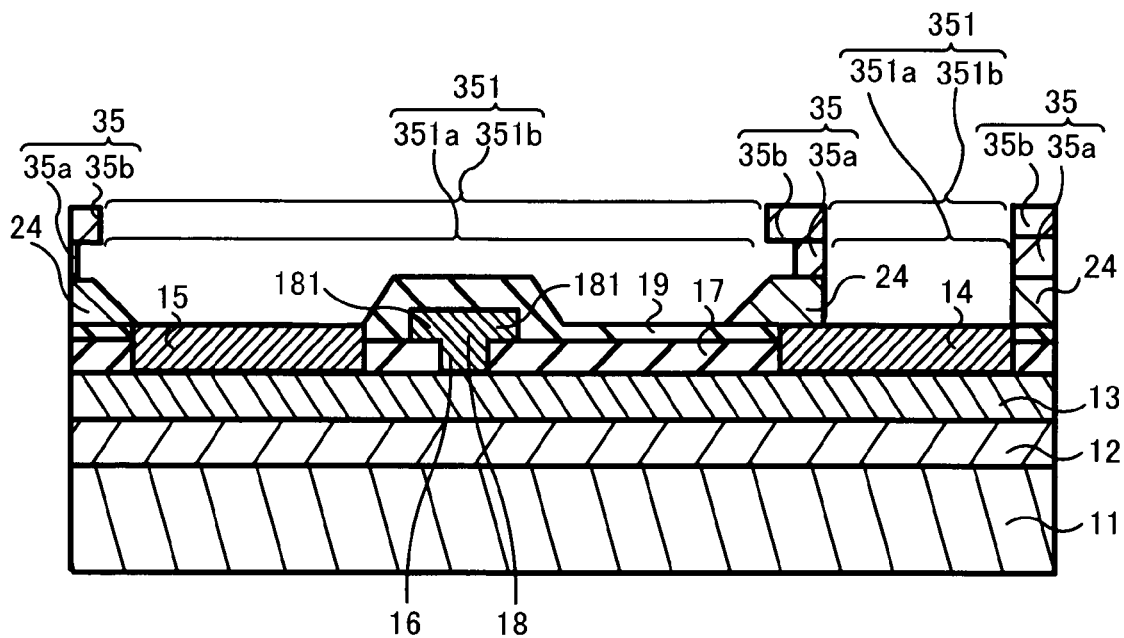
FIG. 9 is a sectional view illustrating a first modified example of a manufacturing method for a semiconductor device according to the embodiment of the present invention, taken along the alternate long and short dashed line A-A' of FIG. 1.
Figure 10:
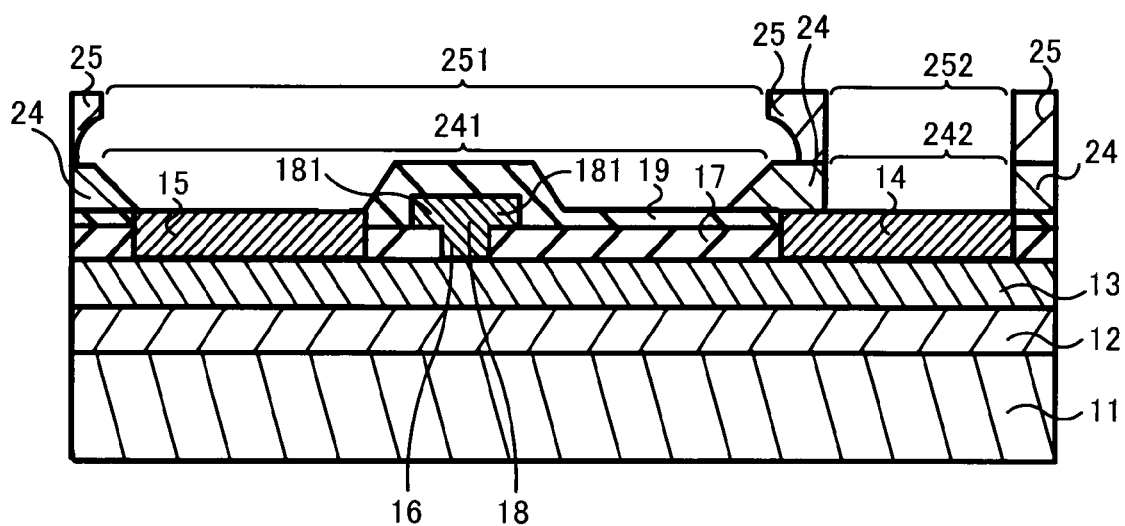
FIG. 10 is a sectional view illustrating a second modified example of a manufacturing method for a semiconductor device according to the embodiment of the present invention, taken along the alternate long and short dashed line A-A' of FIG. 1.

In the embodiment described above, the source field plate electrode 20 is formed using the single-layered third resist layer 25. However, a formation method for the source field plate electrode 20 may be, for example, as follows. Referring now to FIGS. 9 and 10, modified examples of the formation method of the source field plate electrode 20 will be described below as first and second modified examples of the manufacturing method for a semiconductor device.

FIG. 9 is a sectional view illustrating a first modified example of a manufacturing method for a semiconductor device according to the embodiment of the present invention, taken along the alternate long and short dashed line A-A' of FIG. 1. As illustrated in FIG. 9, a third resist layer 35 may have a double-layer structure composed of a fourth resist layer 35a formed from a material that is easily developed and a fifth resist layer 35b formed from a material that is less easily developed than the fourth resist layer 35a. The overhang third opening 351 in the third resist layer 35 composed of the two layers is composed of a fourth opening 351a having a small opening area formed in the fourth resist layer 35a and a fifth opening 351b having a large opening area formed in the fifth resist layer 35b.

FIG. 10 is a sectional view illustrating a second modified example of a manufacturing method for a semiconductor device according to the embodiment of the present invention, taken along the alternate long and short dashed line A-A' of FIG. 1. As illustrated in FIG. 10, the overhang third opening 251 does not always have to have a step-like cross section. For example, the opening may be semicircular in cross section. This is the same for the overhang third opening 351 illustrated in FIG. 9.

The source field plate electrode 20 may be formed by using the third resist layers 25, 35 as illustrated in FIGS. 9 and 10.

What is claimed is:

1. A semiconductor device comprising:
a semiconductor substrate;
an operating layer formed on the semiconductor substrate;
a source electrode and a drain electrode formed on the operating layer so as to be spaced from each other;
a first insulation film formed between the source electrode and the drain electrode and having a band-like opening between the drain electrode and the source electrode;
a gate electrode formed at the opening in the first insulation film;
a second insulation film formed on the first insulation film in such a manner as to cover a surface of the gate electrode; and
a source field plate electrode formed on the second insulation film and the source electrode and having an end portion formed on the drain electrode side of the source field plate electrode, a lower surface of the end portion being spaced from the second insulation film in a vertical direction.

2. The semiconductor device according to claim 1, wherein an angle between the end portion of the source field plate electrode and the second insulation film is larger than 0° but not larger than 90°.

3. The semiconductor device according to claim 2, wherein the end portion of the source field plate electrode is formed above the second insulation film.

4. The semiconductor device according to claim 1, wherein gate field plate electrodes are formed on both end portions of the gate electrode.

5. The semiconductor device according to claim 1, wherein a surface of the source field plate electrode is covered with a surface protection layer.

6. The semiconductor device according to claim 1, wherein an electrode pad is formed on the drain electrode.

* * * * *